(12) United States Patent
Wang

(10) Patent No.: US 6,512,662 B1
(45) Date of Patent: Jan. 28, 2003

(54) SINGLE STRUCTURE ALL-DIRECTION ESD PROTECTION FOR INTEGRATED CIRCUITS

(75) Inventor: Albert Zihui Wang, Wilmette, IL (US)

(73) Assignee: Illinois Institute of Technology, Chicago, IL (US)

(*) Notice: Subject to any disclaimer, the term of this patent is extended or adjusted under 35 U.S.C. 154(b) by 0 days.

(21) Appl. No.: 09/450,576

(22) Filed: Nov. 30, 1999

(51) Int. Cl.[7] ............................................. H02H 9/00
(52) U.S. Cl. ........................................................ 361/56
(58) Field of Search ........................ 361/56, 91.1, 91.2, 361/91.5, 111; 257/355

(56) References Cited

U.S. PATENT DOCUMENTS

| | | | |
|---|---|---|---|
| 4,595,941 A | | 6/1986 | Avery |
| 4,870,530 A | | 9/1989 | Hurst et al. |
| 4,896,243 A | | 1/1990 | Chatterjee et al. |
| 5,237,395 A | * | 8/1993 | Lee .............................. 257/358 |
| 5,287,241 A | * | 2/1994 | Puar ............................. 361/56 |
| 5,359,211 A | * | 10/1994 | Croft ........................... 257/173 |
| 5,430,595 A | * | 7/1995 | Wagner et al. ................. 361/56 |
| 5,440,151 A | | 8/1995 | Crevel et al. |
| 5,541,801 A | * | 7/1996 | Lee et al. ...................... 361/56 |
| 5,546,038 A | * | 8/1996 | Croft ............................ 327/310 |
| 5,572,394 A | * | 11/1996 | Ker et al. ....................... 361/56 |
| 5,576,557 A | * | 11/1996 | Ker et al. ..................... 257/173 |
| 5,616,943 A | | 4/1997 | Nguyen et al. |
| 5,637,887 A | | 6/1997 | Consiglio |
| 5,637,900 A | * | 6/1997 | Ker et al. ..................... 257/355 |
| 5,682,047 A | * | 10/1997 | Consiglio et al. ........... 257/335 |
| 5,706,156 A | | 1/1998 | Narita |
| 5,717,559 A | | 2/1998 | Narita |
| 5,739,998 A | | 4/1998 | Wada |
| 5,786,616 A | | 7/1998 | Fakumoto et al. |

OTHER PUBLICATIONS

Albert Z. Wang et al., "A Novel Dual–Direction IC ESC Protection Device ", *Proceedings of 7th IPFA '99, Singapore*, 1999 IEEE, pp. 151–155. (0–7803–5187–8/99) (No Month).

Kaoru Narita et al., "A Novel On–Chip Electrostatic Discharge (ESD) Protection With Common Discharge Line for High–Speed CMOS LSI's", *IEEE Transactions on Electron Devices*, vol. 44, No. 7, Jul. 1997. (0018–9383/97).

Albert Z. Wang et al., "A New Design Methodology Using Simulation for On–Chip ESD Protection Designs for Integrated Circuits", *1998 IEEE*, pp. 509–512. (0–7803–4306–9/98) No Month.

* cited by examiner

Primary Examiner—Ronald W. Leja
(74) Attorney, Agent, or Firm—Pauley Petersen Kinne & Erickson

(57) ABSTRACT

An overvoltage/overcurrent electrostatic discharge protection single circuit structure for Integrated Circuits protects on all paths and polarities between In/Out, Supply, and Ground pins. The structure is built on the chip substrate with an N well with three P Diffusions therein each containing N+ and P+ diffusions therein to form 6 transistors and 8 parasitic resistors to yield 5 thyristors. The structure provides very fast, symmetrical, full protection while using minimal chip area.

9 Claims, 4 Drawing Sheets

SINGLE STRUCTURE ALL-DIRECTION ESD PROTECTION FOR INTEGRATED CIRCUITS

BACKGROUND OF THE INVENTION

1. Field of the Invention

The present invention relates to protection for semiconductor integrated circuits from over-voltage and over-current conditions caused by electrostatic discharge (ESD). The present invention relates more specifically to a single structure ESD protection circuit using active devices integrated therein.

2. Description of Prior Art

ESD events, which are inevitable in integrated circuit (IC) manufacturing, assembly, and application, generate huge over-current and over-voltage pulses that can fatally damage electronic components. ESD failure emerges as the major reliability concern to the IC industry, accounting for up to thirty percent of field failures. Therefore, industrial standards generally require on-chip ESD protection circuits for all IC chips.

In general principle, an ESD protection circuit is off, or open in normal operation and is triggered on, or closed, during an ESD event to form a low impedance path to shunt the current surge and to clamp the pin voltage to a sufficient level, thereby protecting an IC part from being damaged. To form a complete ESD protection scheme, shown in FIG. 1, protection against ESD pulses of two opposite polarities, or pulse modes, i.e., positive and negative, along a path from each input/output (I/O) pin to both power supply, or $V_{DD}$, and ground, or GND, as well as the path between $V_{DD}$ to GND are required to achieve all direction protection.

Various on-chip ESD protection designs are known. Traditional solutions generally offer low impedance discharging paths in one direction only while relying on a passive current path with much higher impedance for protection in the opposite direction. This means four circuits may be needed for each I/O pin and an additional circuit between supply and ground, if a high level of ESD protection is desired. This solution consumes significant chip area, e.g., up to thirty percent of the whole chip.

Other proposed solutions, such as U.S. Pat. No. 5,739,998 to Wada, may use various combinations of parasitic diodes and SCRs with transistor areas to provide protection for the various paths and pulse modes. Parasitic resistance and capacitance may negatively affect IC performance, as well as offer reduced protection performance because of higher impedance and slower reaction times which may not be adequate for very high speed chips such as RF IC's. In short, there is great need for a single structure circuit covering all ESD paths and pulse modes utilizing only active devices while utilizing minimal chip area.

In *Proceedings of IEEE 7th International Symposium on the Physical and Failure Analysis of IC's*, pp. 151–155, 1999, an ESD protection scheme is disclosed offering improved performance in a compact area providing low impedance active discharge paths in both directions to shunt ESD pulses in two opposite polarities. It therefore requires only two circuits for each I/O pin and a separate ESD circuit for $V_{DD}$ to GND for full ESD protection as seen in FIG. 2. This scheme represents a further size reduction in silicon area consumption over previously known schemes.

SUMMARY OF THE INVENTION

An ESD protection structure according to the present invention forms a single circuit which has a N-well, or N-substrate, having three separate P diffusions (hereinafter "tubs") with the first and third P-tubs having N+ and P+ diffusions for ohmic contact therein. A second P-tub interposed between the first and third tub has two N+ diffusions and one P+ diffusion therein. The I/O pin, or anode, is connected across each of the two N+ diffusions and the P+ diffusion of the second P-tub. The $V_{DD}$, or supply, pin, cathode one, is connected across the N+ and P+ diffusions of the third tub. The ground pin, cathode two, is connected across the P+ and N+ diffusions of the first P-tub. The structure thereby forms six bipolar transistors and eight parasitic resistors and thereby forming a circuit of five thyristors for control of the ESD over-current/over-voltage conditions. The structure set forth herein preferably forms symmetrical upper and lower protection subcircuits. The upper and lower subcircuit have one PNP transistor and two NPN transistors and four resistors creating two thyristors in each protection subcircuit, or structure half, and one thyristor formed between the subcircuits. One protection subcircuit provides positive and negative pulse protection between the I/O pin and the $V_{DD}$ pin. The other protection subcircuit provides positive and negative pulse protection between the I/O pin and the ground pin. The shared thyristor provides both positive and negative pulse protection between the ground pin and the $V_{DD}$ pin. By being built on a single substrate and providing protection against both polarities of surge along all paths, the present invention provides maximum protection with minimal use of IC surface area. The present structure operates symmetrically and responds in the sub-nanosecond range, providing low holding voltage, low discharge impedance adjustable trigger voltage and high failure threshold voltages.

DESCRIPTION OF PREFERRED EMBODIMENTS

Figure 4:
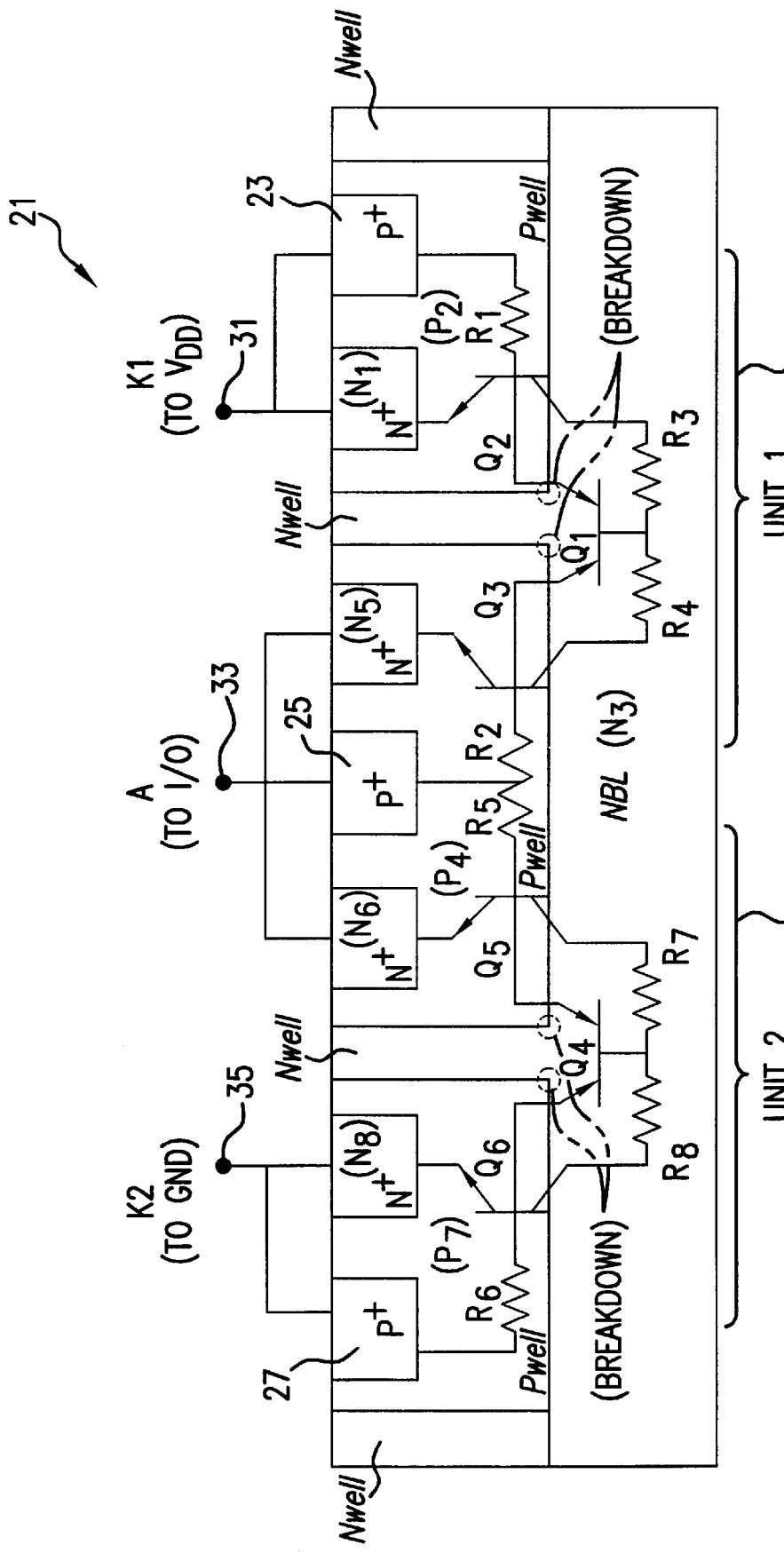
FIG. 4 is a detailed cross-section of the semiconductor structure of the present invention with connections and equivalent circuitry indications therein.

The ESD protection structure 21 seen in cross-section in FIG. 4, has three terminals, namely I/O, $V_{DD}$, and GND. The structure has eight layers: $N_1$, $P_2$, $N_3$, $P_4$, $N_5$, $N_6$, $P_7$, $N_8$. The intrinsic electronic circuitry structure is added for clarity to FIG. 4.

There are three P-type tubs: $P_2$, $P_4$ and $P_7$; with each having a P+ contact 23, 25, 27, respectively, and at least one N+ contact $N_1$ in $P_2$; $N_5$ and $N_6$ in $P_4$; and $N_8$ in $P_7$. The three P-type tubs $P_2$, $P_4$ and $P_7$ are formed in the N-type well, or N Boundary Layer NBL, $N_3$. Six bipolar transistors $Q_1$–$Q_6$ and eight parasitic resistors $R_1$–$R_8$ are formed as electrically connected entities and may be grouped into two functional protection subcircuits: upper, or right, unit one and lower, or left, unit two.

The upper protection subcircuit 22 consists of $Q_1$–$Q_3$ and $R_1$–$R_4$. $Q_1$ is formed by $P_2N_3P_4$. $Q_2$ is formed by $N_1P_2N_3$. $Q_3$ is formed by $N_3P_4N_5$. $R_1$ is formed by the P+ diffusion 23 in the $P_2$ tub and its boundary with $P_2$. $R_2$ is formed by half of the boundary of the P+ diffusion 25 in the $P_4$ tub. $R_4$ is formed at the $P_4N_3$ boundary. $R_3$ is formed at the $P_2N_3$ boundary.

The lower protection subcircuit 29 comprises $Q_4$–$Q_6$ and $R_5$–$R_8$. $Q_4$ is formed by $P_4N_3P_7$. $Q_5$ is formed by $N_6P_4N_3$. $Q_6$ is formed by $N_3P_7N_8$. $R_5$ is formed by the second half of the parasitic resistor of the $P_4$/P+ 23 junction. $R_6$ is formed by the boundary of the P+ diffusion 27 in the $P_7$ tub. $R_7$ is formed by the boundary of P-tub $P_4$ with N-well $N_3$. $R_8$ is formed by the boundary of P-tub $P_7$ with N-well $N_3$.

$Q_3$ and $Q_5$ share the base $P_4$ and collector $N_3$ layers. $R_2$ and $R_5$ split the resistor layer of $P_4$. Each tub $P_2$, $P_4$, $P_7$ has formed across its P+ and N+ diffusions a terminal for a connection to the lead frame pins of $V_{DD}$ 31, I/O 33, and GND (ground) 35, respectively, by known means.

Figure 5:
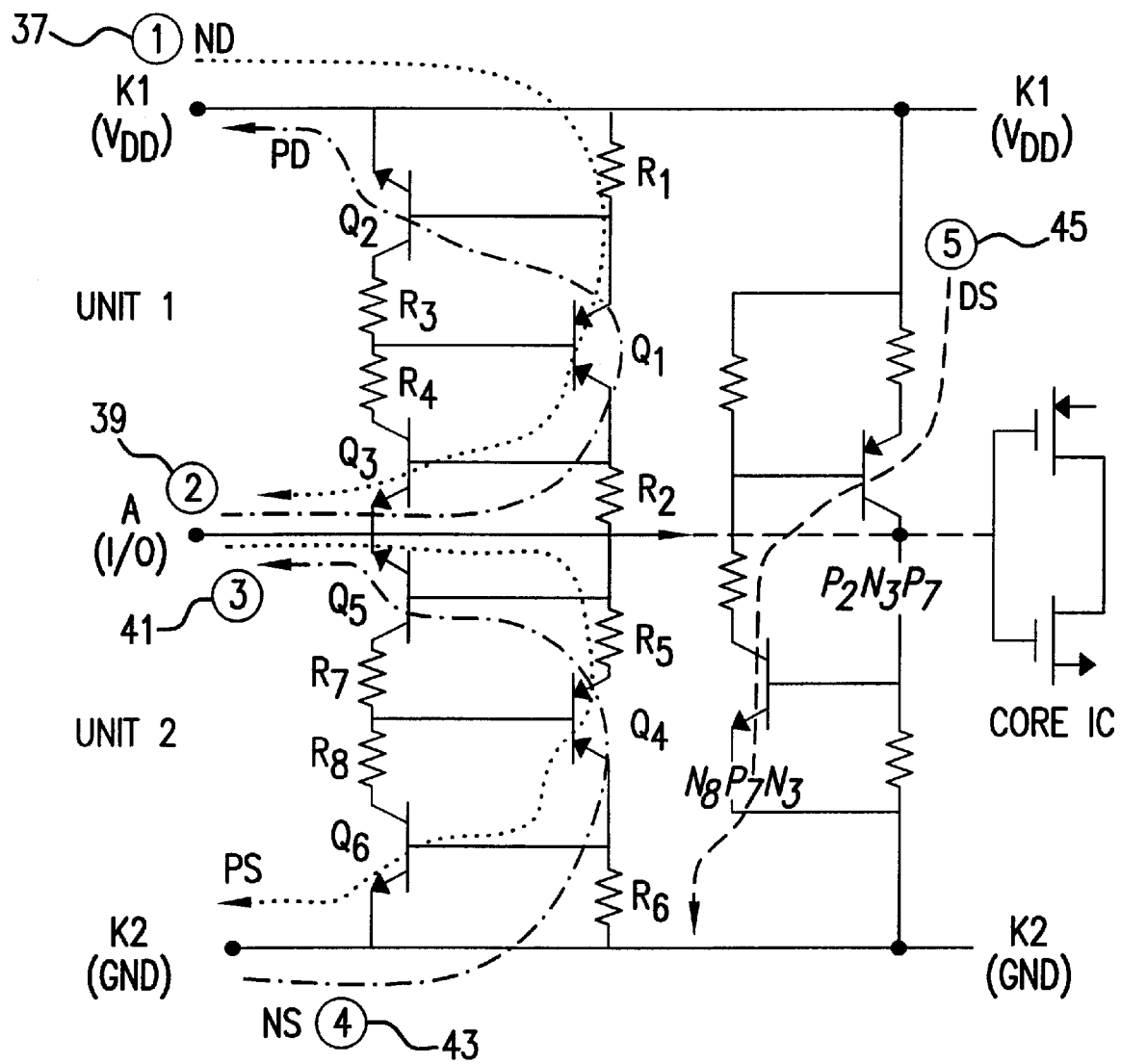
FIG. 5 shows the equivalent circuitry of the present invention.

The ESD protection structure 21 is in the "off" state in normal operation so that it does not interfere with the IC chip function. Referring to FIG. 5, the operation principle is first described for case 1 where a negative ESD pulse occurs at the I/O pin 33 with respect to the supply voltage at the $V_{DD}$ pin 31 and the upper subcircuit 22 serves as the protection subcircuit. With this positive ESD surge appearing from terminal $V_{DD}$ 31 to I/O 33, i.e., negatively from I/O to $V_{DD}$, the base-collector junction ($N_3P_4$) of $Q_1$ is reverse biased to its breakdown where excess electron-hole pairs are generated. It will be noted that changing the P and N compositions at the junctions labeled "breakdown" in FIG. 4 enables the manufacturer to adjust the trigger voltages of the device. The holes will be collected by the negative terminal I/O 33 via the P+ contact of $P_4$. Since both the P+ layer $P_4$ and N+ layer $N_5$ are connected to the I/O terminal 33, the base-emitter junction voltage ($P_4N_5$) of $Q_3$ increases and turns on $Q_3$ This effectively triggers off the corresponding thyristor, $P_2N_3P_4N_5$, and drives it into deep snapback region with low holding voltage $V_h$ less than or equal to two volts. A first active discharge path 37 with negligible impedance is thereby formed to shunt the huge current surge and clamp the I/O pad voltage at a sufficiently low level to protect the core IC from being damaged by the negative I/O-to-$V_{DD}$ ESD pulse. After the ESD pulse is over, the thyristor is quickly discharged and turned off when the current decreases to below its holding current level.

The same mechanism applies to the other four polarity and path cases. In case 2 where a positive I/O-to-$V_{DD}$ ESD pulse occurs at I/O pin, the thyristor $P_4N_3P_2N_1$ of the upper subcircuit works to form a second active discharge path 39. In case 3 where a positive I/O-to-GND ESD pulse occurs at I/O pin, the thyristor $P_4N_3P_7N_8$ of the lower subcircuit works to form a third active discharge path 41. In case 4 where a negative I/O-to-GND ESD pulse occurs at I/O pin, the thyristor $P_7N_3P_4N_6$ of the upper subcircuit works to form a fourth active discharge path 43. In case 5 where a positive or negative $V_{DD}$-to-GND ESD pulse occurs, the thyristor $P_2N_3P_7N_8$ works in the same way to form a fifth active discharge path 45.

Figure 1:
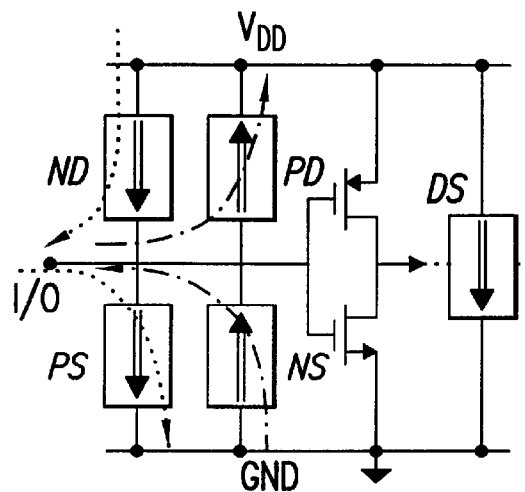
FIG. 1 is a schematic illustration of the traditional scheme for ESD protection.
Figure 2:
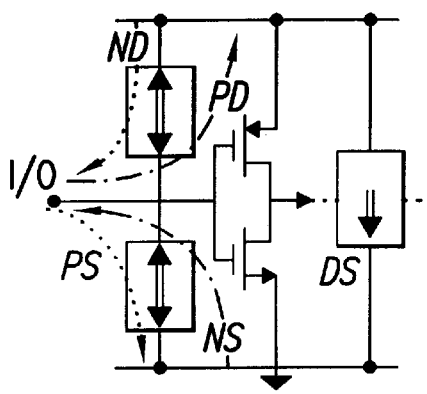
FIG. 2 is a schematic illustration of a known improved scheme for ESD protection.
Figure 3:
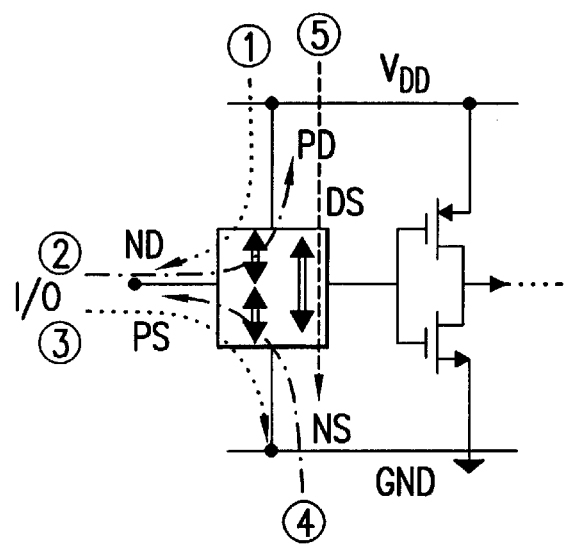
FIG. 3 is a schematic illustration of the single circuit substrate, all active device, all path, all pulse mode, present invention.

In summary, as seen in FIG. 3, only one single device is needed for each I/O pin to protect it against ESD pulses in all four directions as well as to protect ESD surges between $V_{DD}$ and GND, thereby providing the desired all-direction ESD protections for IC chips.

The design of the present embodiment was guided by an unique mixed-mode ESD simulation-design approach that involves both Electra-thermal coupling and device-circuit coupling in simulation, a critical feature in ESD CAD design. Transient ESD simulation was used to simulate the real-world ESD pulsing situation accurately. This transient ESD simulation approach may be the only way to simulate the ultra-fast ESD events and provides such critical information as ESD response time.

Figure 6:
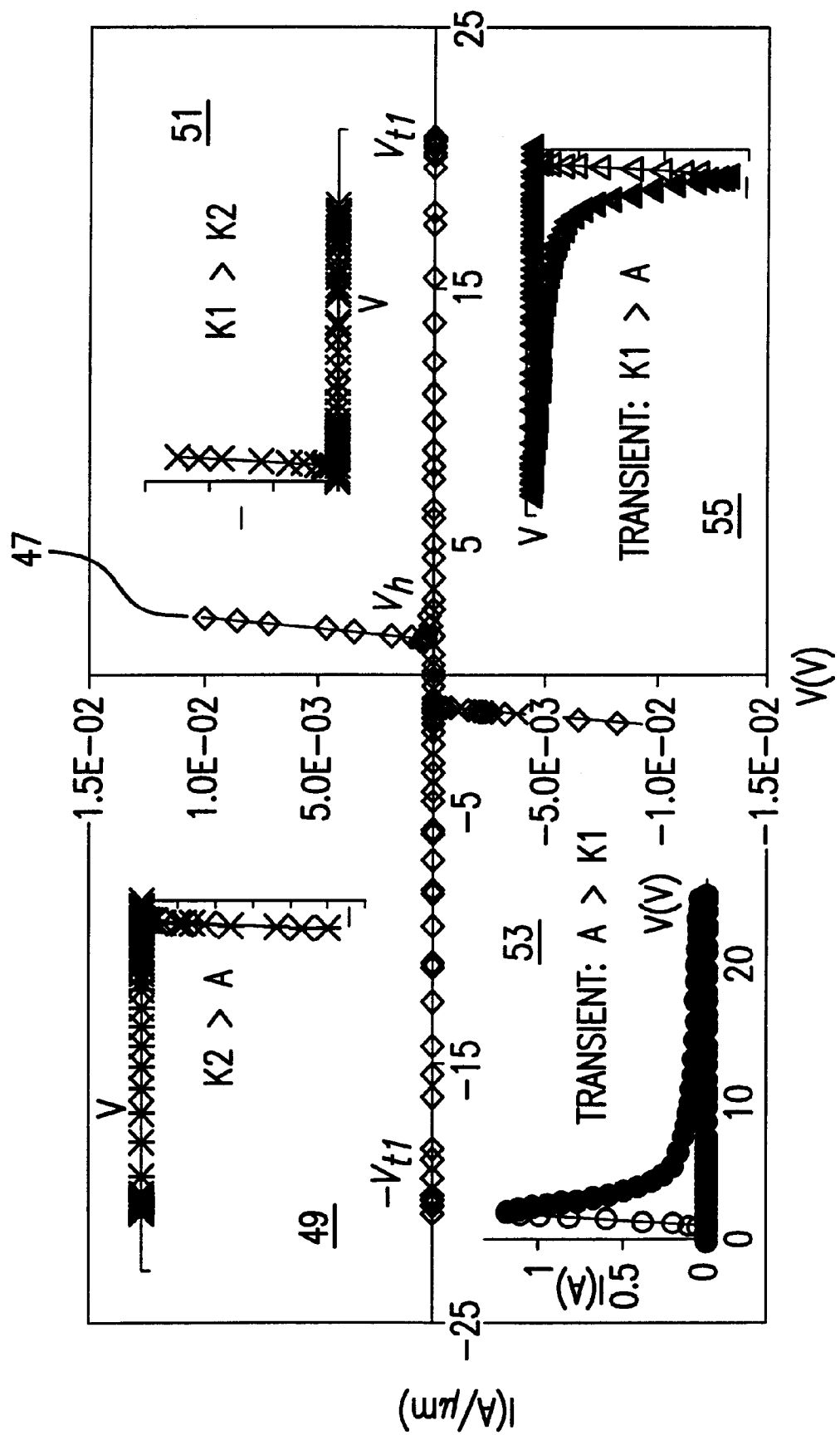
FIG. 6 is a plot of current/voltage behavior for operation of the present invention in various pulse paths and polarities by simulation.

Referencing FIG. 6 there is shown the terminal I–V characteristics of the new ESD structure from both steady-state and transient simulations. The complete simulation work includes all the five ESD pulsing modes as described previously, i.e., I/O-to-$V_{DD}$ (PD & ND), I/O-to-GND (PS & NS), and $V_{DD}$-to-GND (DS). The primary I–V curve 47 in FIG. 6 is from the steady-state I/O-to-$V_{DD}$ (A~$K_1$) simulation for both PD and ND modes. The desired symmetric operation was observed that ensures active discharging paths in both directions. The deep snap-back I-V characteristic indicates very low impedance (R<1Ω) in the current shunting channels and excellent voltage-clamping capability ($V_h \leq 2V$).

The same symmetric operations for I/O-to-GND (A~$K_2$) and $V_{DD}$-to-GND ($K_1$~$K_2$) were observed with example I–V curves for $K_2$-to-A and $K_1$-to-$K_2$ stressing shown in the insets 49 and 51, respectively. Transient simulation results shows the similar properties with example I–V curves for I/O-to-$V_{DD}$ (A~$K_1$) ESD pulsing (PD & ND) shown in the insets 53 and 55 respectively for HBM 2 KV stress.

The transient ESD pulsing simulation indicates that the ESD structure passes a 16 KV HBM test for a 200 μm wide structure, which represents a very high ESDV-to-Si ratio. The simulated ESD response time is at sub-nano-second level ($t_1$~0.16 nS), indicating that it can satisfy the tough IEC European model and the CDM (charged device model) ESD standards. This transient response time can not currently be examined by any existing testers and the transient simulation approach may be the only way to investigate transient response time.

The relative higher triggering voltage ($V_{t1}$) obtained from transient simulation compared to steady-state simulation may be attributed to the charge accumulation time in transient events. Typical simulation data are summarized in Table I, which are well in line with the measurements as discussed below.

TABLE 1

Data summary from computer simulation

| ESD Device Sample | | | $V_{t1}$ (V) | $V_h$ (V) | R (Ω) |
|---|---|---|---|---|---|
| A > $K_1$ stress | Simulation | Steady | 20.82 | 1.31 | ~0.5 |
| | | Trans. | 24.69 | — | — |
| A > $K_2$ stress | Simulation | Steady | 20.49 | 1.31 | ~0.4 |
| | | Trans. | 24.69 | — | — |
| Device Triggering Time, $t_1$ | | | | 0.16 nS | |

Upon study and simulation of the present invention the artisan will realize that the main benefits of this invention include: all-direction full ESD protection, high protection level, small size, low cost and full integration with IC technology.

While in the foregoing specification this invention has been described in relation to certain preferred embodiments thereof, and many details have been set forth for purpose of illustration, it will be apparent to those skilled in the art that the invention is susceptible to additional embodiments and that certain of the details described herein can be varied considerably without departing from the basic principles of the invention.

The disclosed embodiment is intended to be illustrative and not limiting to the present invention which is to be limited only with regard to the appended claims.

I claim:

1. An all direction electrostatic discharge protection structure for an integrated circuit, the integrated circuit having 5 electrostatic discharge paths, including PS, NS, PD, ND, and a DS path having two polarities, the two polarities of the DS path being ground-to-Vdd and Vdd-to-ground, the protection structure comprising:

a single structure having a common substrate and being a circuit having one thyristor in each of the PS, NS, PD, ND, and DS paths, wherein the circuit has five thyristors corresponding in one to one relation to the PS, NS, PD, ND, and DS pats;

wherein each of the five thyristors is capable of being activated by an electrostatic discharge pulse to provide a low impedance path for overcurrent protection and for clamping of pin voltages for overvoltage protection in its corresponding PS, NS, PD, ND, and DS path, the thyristor corresponding to the DS path providing said low impedance path for overcurrent protection and for clamping of pin voltages for overvoltage protection in both of the two polarities of the DS path.

2. The all direction electrostatic discharge protection structure for an integrated circuit of claim 1, wherein the common substrate of the single structure is further common to the integrated circuit being protected.

3. The all direction electrostatic discharge protection structure for an integrated circuit of claim 1, wherein a first thyristor and a second thyristor of the five thyristors cover the PD and ND paths between an I/O pin and a voltage supply pin.

4. The all direction electrostatic discharge protection structure for an integrated circuit of claim 3, wherein a third thyristor and a fort thyristor of the five thyristors cover the PS and NS paths between the I/O pin and a ground pin.

5. The all direction electrostatic discharge protection structure for an integrated circuit of claim 4, wherein a fifth thyristor covers the DS path between the ground pin and the voltage supply pin for both positive and negative polarity pulses.

6. The all direction electrostatic discharge protection structure for an integrated circuit of claim 4, wherein the first through fourth thyristors are formed from six transistors.

7. An all direction electrostatic discharge protection structure for an integrated circuit comprising:

a circuit comprising a single substrate for five thyristors, the five thyristors being individually activated by an electrostatic discharge pulse to provide a low impedance path for overcurrent protection and clamping of pin voltages for overvoltage protection, in each individual discharge path between I/O, GND, and Vdd pins and for each polarity of electrostatic discharge pulse, wherein the protection structure has bilaterally symmetrical halves; and wherein the symmetrical halves form first and second protection subcircuits.

8. The all direction electrostatic discharge protection structure for an integrated circuit of claim 7, wherein the first and second protection subcircuits each form two thyristors.

9. The all direction electrostatic discharge protection structure for an integrated circuit of claim 7, wherein the first and second protection subcircuits together form a shared thryristor.

* * * * *